United States Patent [19]

Lux et al.

[11] Patent Number: 4,582,240

[45] Date of Patent: Apr. 15, 1986

[54] METHOD FOR LOW TEMPERATURE, LOW PRESSURE METALLIC DIFFUSION BONDING OF PIEZOELECTRIC COMPONENTS

[75] Inventors: Andrew A. Lux, Westlake; Gerald D. Schindler, Chagrin Falls, both of Ohio

[73] Assignee: Gould Inc., Rolling Meadows, Ill.

[21] Appl. No.: 578,008

[22] Filed: Feb. 8, 1984

[51] Int. Cl.[4] .................................................. B23K 31/02
[52] U.S. Cl. ...................................... 228/121; 228/122; 228/263.12
[58] Field of Search ............ 228/121, 122, 124, 263.12

[56] References Cited

U.S. PATENT DOCUMENTS

| | | | |
|---|---|---|---|
| 2,709,147 | 5/1955 | Ziegler | 154/128 |
| 2,964,839 | 12/1960 | Marafioti et al. | 228/263.12 X |
| 3,058,210 | 10/1962 | Winters | 29/472.7 |
| 3,111,741 | 11/1963 | Allen et al. | 228/122 X |
| 3,153,839 | 10/1964 | Pakswer et al. | 29/155.5 |
| 3,235,943 | 2/1966 | Marafioti | 29/155.5 |
| 3,252,722 | 5/1966 | Allen | 287/189.365 |
| 3,448,503 | 6/1969 | Trott et al. | 29/25.35 |
| 3,766,634 | 10/1973 | Babcock | 29/471.9 |
| 3,883,946 | 5/1975 | Dale | 228/121 |
| 4,077,558 | 3/1978 | Carlson et al. | 228/121 |

OTHER PUBLICATIONS

Article in *Physical Review*, vol. 151, No. 2, Nov. 11, 1966, entitled "Interstitial Diffusion of Gold and Silver in Indium", by Anthony et al.
Article in *Journal of Applied Physics*, vol. 37, No. 6, May 1966, entitled "Interstitial Diffusion of Copper and Silver in Lead", by Dyson et al.
Article in *Journal of Applied Physics*, vol. 37, No. 6, May 1966, entitled "Diffusion of Gold and Silver in Tin Single Crystals", by Dyson.
Chapter 4 entitled "Fast Diffusion in Metals" from book entitled *Diffusion in Solids*, published by Academic Press, 1975; Chapter 4 authored by Warrenton et al.

*Primary Examiner*—Robert P. Olszewski
*Attorney, Agent, or Firm*—Robert J. Fox; George P. Edgell; Edward E. Sachs

[57] ABSTRACT

A method for intermetallic diffusion bonding of piezoelectric components, wherein ceramic pieces with fired-on silver electrodes are stacked with a thin shim of solid indium alloy therebetween. The indium alloy preferably comprises 25% indium, 37.5% lead and 37.5% tin. The stack is placed under 150 psi compression and heated at a temperature of about 350° for 30–48 hours in an inert gas. Almost immediately upon being heated, a liquid-solid diffusion takes place in which a small amount of the silver diffuses from the electrodes into the now liquid indium alloy. The alloy in the interface becomes saturated with silver producing a new quaternary alloy which has a higher melting point than the previous indium alloy shim. Thus, there is a gradual solidification of the alloy as the concentration of silver increases. After solidification of the new alloy during the remainder of the heating time, there is a gradual diffusion of the indium into the silver and vice versa. The bi-directional solid-solid diffusion of the indium and silver gives the bond a strength higher than known in the prior art.

23 Claims, 3 Drawing Figures

METHOD FOR LOW TEMPERATURE, LOW PRESSURE METALLIC DIFFUSION BONDING OF PIEZOELECTRIC COMPONENTS

BACKGROUND OF THE INVENTION

The present invention is directed to a method for bonding materials together, and more particularly to a method for interstitial solid/solid diffusion of a noble metal into a ternary alloy in order to bond piezoelectric ceramics.

Some materials, such as certain crystals and ceramics, exhibit what is called piezoelectric effect, i.e., mechanical strain due to the application of an electric field to the material. In order to take advantage of this effect, several ceramics may be joined together to form a "stack" with means for connecting an electric circuit. More particularly, piezoelectric assemblies may be formed by bonding a stack of electromechanically responsive ceramic elements with electrodes interposed therebetween.

The resulting piezoelectric assemblies may be used for, e.g., frequency control, frequency measurement, electric wave filtering, or interconversion of electric waves and elastic waves. An example of such a piezoelectric assembly is a piezoelectric transducer.

The present invention is directed to a method of efficiently and effectively bonding piezoelectric ceramics together to form a piezoelectric transducer.

Organic chemical compounds have been used to bond ceramic elements and their electrodes into a piezoelectric assembly. Organic adhesives, such as epoxy resins, however, do not possess optimum elastic moduli or electrical conductivity characteristics. For example, epoxy adhesives absorb a large portion of the acoustic energy and provide a low mechanical/electrical coupling efficiency. In addition, the elastic properties of the epoxy change with aging and moisture content. Furthermore, many commonly employed adhesives require relatively high curing temperatures which are harmful to ceramics.

Alternatively, it is known that intermetallic "diffusion bonding" processes provide strong metallic bonds between selected metals. Diffusion bonding is basically the process of facing two elements together under certain temperature, pressure and time conditions, wherein a bond is produced between the facing surfaces thereof due to the diffusion of the elemental components at the facing surfaces. In some diffusion bonding processes, an intermediate layer, e.g., an alloy, is applied between the facing surfaces to effect a bond.

Conventional diffusion bonding processes, however, have several drawbacks. Firstly, diffusion bonding processes using "substitutional" diffusion (in which atoms of different types simply exchange places in the crystal lattice), like adhesive bonding, also require quite high temperatures—generally above the Curie point of ceramics used in piezoelectric transducers—which renders them useless for the production of relatively sensitive transducer ceramics. Secondly, diffusion bonding processes using "interstitial" diffusion (in which smaller atomic species move across the interface to occupy a location in the interstices of the lattice structure of the larger species) generally create very brittle alloys in the bonding region.

More particularly, it is known that indium, either in a pure state or as part of an alloy, and silver may be used in intermetallic bonding. For example, U.S. Pat. No. 2,709,147, issued to Ziegler, utilizes vapor deposited pure indium as a joining metal between a piezoelectric quartz crystal and a body of fused silica. However, this process requires an undesirably elaborate degree of preparation. For example, the flatness of the silica bodies must be very exacting optically, and a very high vacuum condition must be present during vapor deposition. In addition, expensive and complicated facilities are required for controlling vapor deposition and baking. Finally, a relatively high amount of silica/indium intermetallic formation occurs causing poor tensile properties.

U.S. Pat. No. 3,153,839, issued to Pakswer et al., discloses a method for forming a vacuum-tight seal between two glass components using an indium alloy (50% In and 50% Sn) which is heated at a temperature below 200° C. This process, however, provides only a medium magnitude of alloy tensile strength. If this process were used with silver coated piezoelectric ceramics, there would result a high percentage of brittle silver/indium intermetallic phase formations.

U.S. Pat. No. 3,235,943, issued to Marafioti, teaches a method of producing a delay line utilizing a first layer of pure indium soldered at 180° C., a second layer of an indium alloy (98% In, 1% Sn and 1% Pb) soldered at 180° C. and finally, a third layer of an indium alloy (58% In, 41% Sn and 1% Pb) soldered at 135° C. The rubbed soldered joint of pure indium, however, is very weak and displays unreliable joint integrity. In addition, the relatively short time available for soldering is impracticable in regard to bonding stacks of ceramics.

U.S. Pat. No. 3,252,722, issued to Allen, utilizes a relatively thick (2000°A) vapor deposited gold coat and a maximum 0.5 mil. vapor deposited indium coat for joining quartz crystals (nickel and aluminum coatings are also used and serve as barriers in the substrate). Although the temperature and pressure conditions of this method are relatively low, intermetallic compound formations are relatively high, the very thin gold coat is easily dissolved by the thicker indium coat, the concentration gradient is very steep due to diffusion and the tensile property of the indium bulk layer is weak.

U.S. Pat. No. 3,883,946, issued to Dale, discloses a method for securing a semiconductor body to a substrate by applying therebetween an intermediate malleable metal layer of soft solder material having a melting point in the range of 125° to 330° C. This intermediate layer is preferably a lead alloy (95% Pb, 3.5% Ag and 1.5% Sn). A mechanical bond is obtained via the intermediate layer by placing the assembly of the semiconductor body, intermediate metal layer and substrate in a press under a high pressure range of 1–5 tons per square inch and a temperature range of 75° to 300° C. (which is not only below the melting point of the intermediate metal layer, but which is also below the temperature at which any liquid phase would form) for a period of not more than 30 seconds. The resulting bond strength, however, is relatively low.

Finally, in regard to using silver to bond, U.S. Pat. No. 3,448,503, issued to Trott et al., utilizes a silver/silver-amalgam joint under relatively low temperature conditions. However, 100% intermetallic compound formation occurs causing a very brittle joint. In addition, the thin silver electrode dissolves easily during the amalgamation reaction causing poor reliability and the process is very dangerous to perform due to the poisonous mercury vapor created during the process.

From the foregoing, it can be seen that a fluxless diffusion bonding method is desired which produces a bond of high strength and low compliance (i.e., high stiffness), while using relatively low temperature and pressure conditions.

SUMMARY OF THE INVENTION

Accordingly, it is a primary object of the present invention to provide a fluxless bonding process for joining piezoelectric components of transducer modules for improved acoustical and electrical efficiency.

It is another object of the present invention to replace epoxy bonds with metallic bonds, without degrading the piezoelectric properties of the transducer, for improved mechanical/electrical properties.

It is another object of the present invention t provide a method for bonding fired, electroded and poled ceramic pieces which is compatible with conventional transducer manufacturing techniques.

It is another object of the present invention to provide a method for producing a bond with a tensile strength at least as strong as the ceramic material being bonded, i.e., about 3500 pounds per sq. inch.

It is another object of the present invention to provide a method for forming a bond which is as stiff as possible and yet does not introduce any additional mechanical losses.

It is another object of the present invention to provide a method not requiring exotic or unusually expensive materials or manufacturing equipment and facilities.

It is another object of the present invention to provide a method which employs well-known electroding techniques which are relatively inexpensive.

It is another object of the present invention to provide a diffusion bonding method which is less labor intensive than conventional epoxy bonding methods.

It is another object of the present invention to provide a method for providing a fluxless, metallic, interstitial, solid/solid diffusion of a noble metal, e.g., silver or copper into a ternary alloy including indium to form a new quaternary bonding alloy having increased strength and fatigue resistance.

Additional objects and advantages of the invention will be set forth in part in the description which follows, and, in part, will be obvious from the description, or may be learned by practice of the invention. The objects and advantages of the invention may be realized and obtained by means of the instrumentalities and combinations particularly pointed out in the appended claims.

To attain the objects described above, in the preferred embodiment of the diffusion bonding method of the present invention there is provided a pair of ceramic pieces with fired-on silver electrodes located therebetween and a thin shim of indium alloy between the electrodes. The indium alloy preferably comprises 25% indium, 37.5% lead and 37.5% tin. This "stack" is placed under moderate compression of about 150 psi and is then placed in an inert gas atmosphere (e.g., Argon) at a temperature of approximately 350° F. Almost immediately a liquid-solid diffusion takes place in which a small amount of the solid silver diffuses from the electrodes into the now liquid indium alloy. The alloy in the interface then becomes saturated with silver producing a new quaternary alloy which has a higher melting point. Thus, there is a gradual solidification of the alloy as the concentration of silver increases. After complete solidification of the alloy, there is then a gradual diffusion of the indium into the silver and vice versa. It is this bi-directional solid-solid diffusion of the indium and silver which gives the bond its high strength. The preferred diffusion time is 30–48 hours. After 48 hours, the remaining alloy tensile strength is 5260 psi and the bond strength is greater than 3500 psi.

In contrast to pre-existing diffusion bonding technology, this process involves a relatively low temperature (approximately 350° F.) which allows it to be used with poled piezoelectric ceramic materials without the undesirable significant depoling usually observed with conventional high temperature processes. This diffusion bonding process is different from both low temperature soldering (i.e., conventional indium soldering) and metallic compound adhesion (e.g., mercury amalgam) in that the tensile strength of both the resulting bond and the remaining metal alloy are quite high.

This diffusion bonding process is best suited for use in bonding transducer ceramics into high quality stacks. The process, eliminates the need for standard organic adhesives and provides a solid metal bond of high strength and low compliance.

More particularly, the diffusion bonding process of the present invention can be a direct replacement for conventional epoxy bonding processes in any transducer design. Because of the simplicity of the process of the present invention, its application reduces production costs when compared to the somewhat labor intensive conventional adhesive bonding processes. The reproducibility of the mechanical properties of the bond are also quite good because there are no manual steps involved (such as adhesive mixing and dispensing).

These together with other objects and advantages which will become subsequently apparent reside in the details of construction and operation as more fully hereinafter described and claimed, reference being had to the accompanying drawings forming a part hereof, wherein like numerals refer to like parts.

DETAILED DESCRIPTION OF THE PREFERRED EMBODIMENTS

Figure 1:
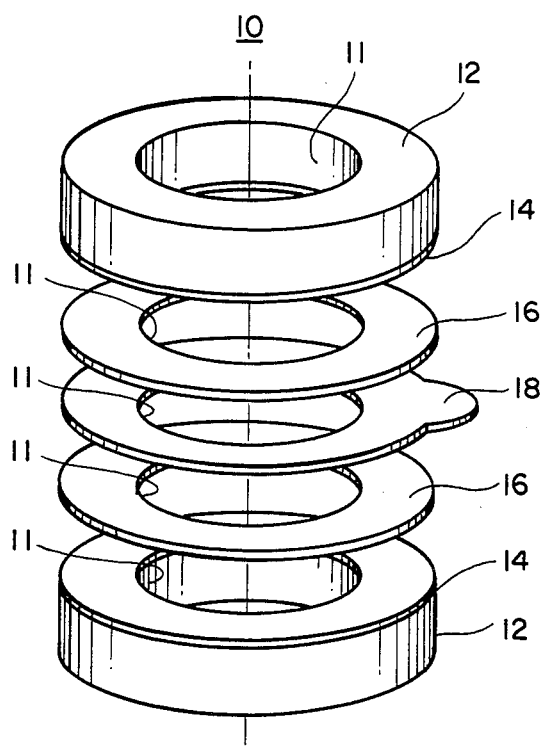
FIG. 1 is an exploded perspective view of an embodiment of the diffusion bond assembly of the present invention, illustrating particularly a "stack" comprising a pair of ceramics with fired-on silver electrodes, a pair of indium alloy shims and a silver electrode lead.

The inventors of the present invention contemplated indium and silver as particularly compatible metals for interstitial diffusion. For example, because indium has a melting point of 314° F., the indium atoms have a high mobility near this temperature. Thus, diffusion can take place at temperatures well below the Curie point of piezoelectric ceramics. In fact, considering the possibility of the existence of ionized species of both indium and silver, bi-directional interstitial diffusion was thought highly possible, potentially forming a superior bond at the interface of the silver and indium. However the bulk indium which would remain in the bonding region between two pieces of ceramic would have a tensile strength of only 575 psi. This tensile strength was considered too weak for a high reliability manufacturing application, such as required for producing piezoelectric transducers.

Thus, the inventors experimented with various alloys to improve bonding properties. By combining certain metals in particular concentrations in the bonding region it was found possible to increase the tensile strength of the alloy without also interfering with the diffusion process at the interface.

More particularly, a number of different alloys were tested to determine a combination providing optimally high bond and tensile strength of the remaining alloy, and providing a reasonable time/temperature/pressure relationship for the bonding process. The resulting mechanical properties of some of the alloys tested are set out below:

| Alloy | Composition %* | Melting Point/ Range (°F.)* | Tensile Str. of Alloy (psi)* | Measured Bond Strength (psi) After Diffusion Time (Hrs.) | | | |
|---|---|---|---|---|---|---|---|
| | | | | 6 Hrs. | 24 Hrs. | 48 Hrs. | 72 Hrs. |
| A | 80 In, 15 Pb, 5 Ag | 301 | 2550 | 141 | 442 | 710 | 600 |
| B | 100 In | 314 | 575 | 106 | 282 | 420 | 380 |
| C | 25 In, 37 Sn, 37 Pb | 274/358 | 5260 | 910 | 2270 | >3500 | 2900 |
| D | 50 In, 50 Pb | 356/408 | 4670 | 257 | 1820 | 3009 | 1972 |
| E | 12 In, 70 Sn, 18 Pb | 324 | 5320 | 375 | 856 | 1061 | 870 |
| F | 62.5 Sn, 36.1 Pb, 1.4 Ag | 355 | ~7700 | 305 | 426 | 1972 | 1800 |
| G | 97 In, 3 Ag | 289.5 | 800 | 283 | 446 | 707 | 620 |

*Values obtained from Ludwick's: Indium, published by the Indium Corporation of America.

The preferred alloy composition of the present invention is the multi-component alloy made up of 25% indium, 37.5% lead and 37.5% tin. After 48 hours of diffusion bonding according to the present invention, the tensile strength of this preferred alloy is 5260 psi, and the bond strength is greater than 3500 psi.

This preferred alloy was chosen for the following reasons:

(a) a low melting range (274°–358° F.);

(b) low solubility of a thin layer (0.5 mil.) of silver deposition;

(c) minimizes the formation of silver-indium intermetallic compounds;

(d) the lead additive increases bond strength; and (e) the tin additive improves fatigue resistance.

Although this particular alloy is preferred, basically it is most important that the three components—indium, lead and tin—be combined to form an alloy for diffusion bonding. The indium provides high diffusion mobility, the lead provides high tensile strength, and the tin provides increased fatigue resistance.

Figure 2:
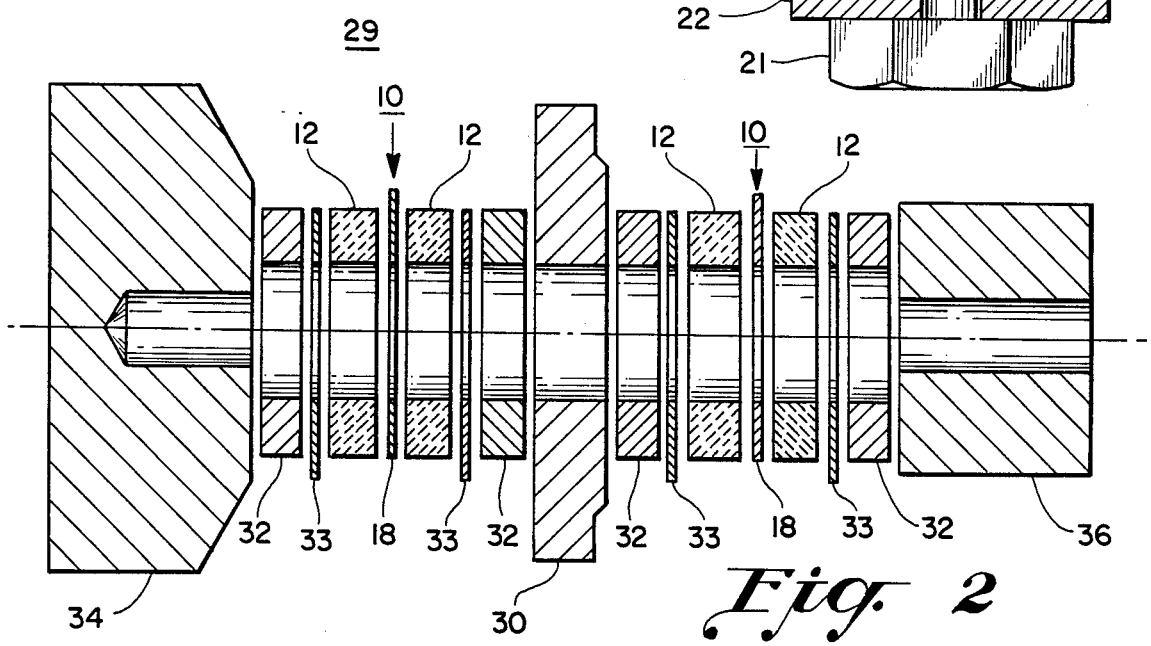
FIG. 2 is a schematic view of a pair of "stacks" according to the present invention combined to form a transducer.

The preferred embodiment of the method of diffusion bonding a piezoelectric stack according to the present invention will now be described. As best seen in FIGS. 1 and 2 each piezoelectric stack 10 comprises a pair of ceramic pieces 12. Each ceramic piece 12 has a noble metal layer 14 applied thereto (e.g., a fired-on silver electrode layer which will be referred to hereafter as layer 14), and both ceramic pieces 12 are then combined with a thin indium alloy shim 16 therebetween at a temperature less than the liquidus point of the alloy. The shim 16 is preferably initially 0.002 inches thick.

If a metallic lead for wiring connections is desired in the stack 10, a lead 18, e.g., a solid silver lead, may be used with an indium alloy shim 16 on each side (see FIG. 1).

Figure 3:
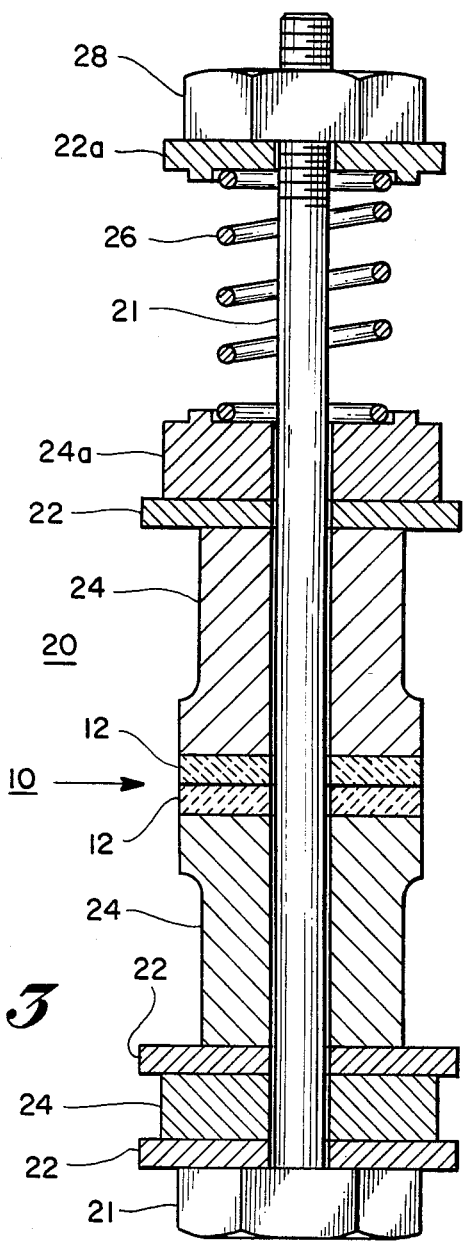
FIG. 3 is a side view of a spring apparatus generally known in the art used to compress the ceramics being bonded.

The stack is placed under moderate compression in the conventional fixture 20 shown in FIG. 3, e.g., about 150 psi maintained throughout the temperature cycle. More particularly, each element of the stack 10 is ringlike having a central hole 11 which may be placed around the bolt 21 of the fixture 20 between a plurality of washers 22 and spacers 24. Finally, a spring 26 is placed between the top spacer 24a and the top washer 22a/nut 28 combination.

A single stack 10 comprising two bonded ceramic pieces 12, or a set of stacks 10, may be compressed by the fixture 20. In either case, the pressure remains constant throughout the fixture 20.

Although a spring-biased compression fixture 20 is preferred, a number of other means exist in the art for applying pressure when practicing the present invention, e.g., dead weighting.

The stack 10 under compresion is then placed in an electric vacuum oven with a temperature regulator. The oven is filled with, e.g., Argon gas close to atmospheric pressure for optimized heat transfer through a two-step pressure regulator.

Once placed in the oven, a number of processes take place in fairly rapid succession. The temperature of the oven is approximately 350° F. which is near the upper end of the melting range for the preferred embodiment of the indium alloy of the shim 16 (274° to 358° F.). Thus the indium alloy shim 16 partially melts and wets the surface of the silver electrodes 14. It is at this point that some of the molten indium alloy from the shim 16 is squeezed from the edges of the bond. The remaining alloy thickness is determined by the temperature and pressure at this point in the process.

Because the indium alloy melts during the initial phase of the process, the stack 10 shortens somewhat as some of the molten indium alloy of the shim 16 is squeezed from the joint. The fixture 20 mostly accommodates for this dimensional change, while still maintaining the preferred compression.

Almost immediately after the indium alloy becomes liquid, a liquid-solid diffusion takes place in which a small amount of silver diffuses from the silver electrodes 14 into the liquid alloy. The alloy in the interface becomes saturated with silver producing a new quaternary (four-component) alloy which has a higher melting point than the indium alloy making up the shim 16. Thus there is a gradual solidification of the alloy as the concentration of silver increases. The process to this point takes place very quickly, i.e., a few seconds.

After solidification of the alloy and during the remainder of the time in the oven, which is between 6 and 78 hours, depending upon the thickness of the silver components chosen, there is a gradual diffusion of the indium into the silver and vice versa. The preferred time for diffusion, however, is 30–48 hours. There is also a small amount of diffusion of the other alloy constituents, i.e., lead and tin. Although the lead and tin diffusion is much slower tha the indium-silver migration, it does play a significant role in giving the bond its high strength.

During the diffusion process according to the present invention it is also possible to apply alternating current to the ceramic stack to cause expansion and contraction of the ceramic pieces. The alternating current manifests itself as acoustic-energy, analogous to an ultrasonic welding process. This expansion and contraction actually enhances the overall mobility of the diffusing atoms, and thus increases the speed and efficiency of the diffusion process of the present invention.

One aspect of the diffusion bonding process of the present invention is more critical than with conventional bonding methods, i.e., the preparation of the surfaces of the silver electrodes 14 to be bonded. Any trace of oxide or sulfide on the silver electrodes 14 will locally inhibit the diffusion process and create a region of no adhesion. Failures of this can easily be detected by in-process tests known in the art.

A scanning electron micrograph of a sectioned diffusion bond according to the present invention (ceramic pieces with their fired-on silver electrodes, and the solid silver electrical lead at the center) shows that between the fired-on electrodes and the lead in the center is a region containing the remaining alloy which, after the process, contains the quaternary alloy including indium, silver, lead and tin. The thickness of the remaining indium alloy is consistently about a half mil. (0.0005 in.). Also seen is a faint "shadow line" along each side of the center electrical lead. This line defines the extent of the dominant indium diffusion into the solid silver contact. An equivalent line in the fired-on silver electrodes is obscured by the grainy structure of the electrode material. There is no clear line of demarcation in the indium alloy since it conains a fairly uniform concentration of silver due to the early liquid-solid diffusion. Diffusion occurs throughout this region although it does not leave a noticeable line.

Tensile strength testing of bonded ceramic test specimens made according to the present invention has shown that the bond strength is greater than the tensile strength of the ceramic. The bond strength may actually be further increased by increasing the diffusion time. However, increasing diffusion time may degrade somewhat the piezoelectric properties of the ceramic.

Nevertheless, a minor change may occur in the ceramic properties during practice of the present method. It has been determined that the ceramic piece capacitance increases by about 20%, while the effective thickness mode coupling coefficient decreases by about 5% (from 0.57 to 0.54). However, the capacitance change is of no concern to the transducer designer and the coupling decrease is small. The character and size of the observed material changes are the same as those observed when treating ceramic to stabilize the internal stresses created during the poling process.

The bulk modulus of the diffusion bonding alloy of the present invention is an order of magnitude greater than that of epoxies normally used in ceramic bonding. There is some evidence to suggest that the superior mechanical properties of the diffusion bond of the present invention more than compensate for the slight degradation in the ceramic properties discussed above, thus yielding completed stacks of higher quality than conventional epoxy techniques.

The present invention, since it uses relatively low temperatures, allows it to be used with poled piezoelectric ceramic materials without the usual significant depoling effect caused by high temperature processes. Since exposing a poled ceramic piece to heat for a period of time may cause it to experience some depole, direct current may be applied to the stack during processing to maintain its orientation to polarization.

As seen in FIG. 2, the present invention can be used to produce a superior piezoelectric transducer module 29. A node ring 30 is flanked by insulators 32, e.g., fired-on silver coated aluminum oxide insulators, and silver or copper electrodes 33, in that order. A stack 10, as produced by the process of the present abovedescribed invention, is placed on either side of the electrodes 33. Another silver or copper electrode 33 is positioned against the outside of each stack 10. Next, another fired-on silver coated aluminum oxide insulator 32 is positioned adjacent each of the latter silver or copper electrodes 33. Finally, an aluminum fronting block 34 and a brass backing block 36 border the assembly.

Each of the above-referenced elements 10 and 30–36 can be joined by using the bonding process according to the present invention, including the preferred alloy comprising indium, lead and tin. In brief summary of the above-described process, the stacks 10 are joined to the electrodes 33 on both sides thereof and the electrodes 33 are respectively bonded to the fired-on silver coated aluminum oxide insulators 32 with the low temperature (350°), low pressure (150 psi), fluxless diffusion process of the present invention using an indium alloy in an Argon gas environment.

Practical applications of the method of the present invention will now be described.

Diffusion bonding according to the present invention is applicable to any transducer design incorporating a bonded ceramic stack. Using the stacks so formed in a transducer module provides a transducer with improved mechanical/electrical efficiency, and thus higher sensitivity.

In a production environment, diffusion bonding according to the present invention provides a significant labor saving compared to conventional epoxy methods. It may also find application as a cost reduction modification to existing systems. In this case some consideration must be given to the differences in electrical and mechanical properties of the stack, but these are not significant changes and can be readily accommodated by a person having ordinary skill in the art.

More important are the potential performance advantages which are available with a metallic bond of high stiffness and low mechanical loss. The availability of the diffusion bond of the present invention actually makes it possible to consider new types of transducer designs which are not feasible with conventional bonding techniques.

For example, the desire to drive transducers to higher power levels, and to use higher electric fields, dictates the use of thinner pieces of ceramic in stack designs.

However as the ceramic pieces are made thinner, the relative contribution of the bonding material to the composite stack usually degrades mechanical properties.

Organic adhesives tend to be quite compliant and exhibit relatively high mechanical loss compared to the ceramic itself. The thickness of an epoxy bond is approximately 0.001 in., and there are generally two bonds per ceramic piece when electrical leads with solder tabs are included. This places a practical lower limit of about 0.100 in. on the thickness of ceramic pieces for use in high efficiency designs.

Since the compliance of the diffusion bond formed according to the present invention is lower than that of epoxies by a factor of 3 to 5, and the damping is most likely lower, it should be possible to achieve high quality stacks at a ceramic thickness of 0.010 in.

In addition, the metallic bonds according to the present invention, provide a readily available heat transmission path for heat generated by losses in the ceramic during high power operation.

Thus, the combination of lower mechanical loss of the metallic bonds formed by the present invention and the continuous metallic heat path should allow ceramic operation at higher electric fields than are currently considered safe by using conventional bonding methods. The primary factor limiting the electric field in current designs is the fact that the internal damping of the ceramic increases at high electric fields causing an unacceptably large temperature rise in the ceramic pieces conventionally used. This effect should not occur in properly designed stacks of thin ceramic pieces with metallic bonds formed according to the present invention, potentially allowing the use of higher fields and consequently higher power operation.

In addition, if the drive voltages required by a transducer can be held below about 500 volts RMS, then it becomes possible to drive the transducer directly from the output of a semiconductor amplifier without the need for a step-up transformer. In regard to conventional transducer designs, by using the method of the present invention, it should be possible to decrease the ceramic ring thickness by a factor of 2 to 5 while leaving the total stack length constant. This provides a transducer with nearly identical mechanical properties to those presently available, but having a lower drive voltage requirement for equal output power.

Finally, tonpilz transducer elements made from stacks of thirty-three mode ceramic rings or disks are generally problematic at high frequencies because the ceramic piece length becomes small. Again the relative thickness of the bond region becomes significant and performance suffers. Using the diffusion bonding method of the present invention, it should be possible to design efficient tonpilz elements at frequencies as high as 100 kHz, at which point the parts become so small that mechanical considerations alone dictate alternative approaches.

In summary of the practical applications of the present invention, the major advantages of this diffusion bond process, i.e., low compliance and minimal mechanical loss, are most pronounced in critical applications involving high power, high electric field, thin ceramic pieces, or some combination of these features. Conventional epoxy bonding in these cases yields poor quality ceramic stacks due to the relatively high volume of highly compliant, electromechanically inactive adhesive material in the stack.

The foregoing is considered as illustrative only of the principals of the invention. For example, the present invention may also be used to bond quartz pieces with minor modification to the overall process, which modifications are within the knowledge of an ordinarily skilled person in the art. Further, since numerous modifications and changes will readily occur to those skilled in the art, it is not desired to limit the invention to the exact construction and operation of the embodiments shown and described. Accordingly, all suitable modifications and variations falling with the scope of the appended claims and their equivalents are intended.

We claim:

1. A method of diffusion bonding first and second mating components, comprising the steps of:
(a) applying a noble metal to each of the first and the second components to form mating surfaces;
(b) positioning a first layer of an alloy consisting essentially of indium, tin and lead between the noble metal mating surfaces of the first and second components to form a stack, while the surrounding temperature is a first temperature less than the liquidus point of the alloy thereby liquifying a small portion of the indium, tin and lead which dissolves a small amount of the noble metal after which the mixture of indium, tin, lead and noble metal alloy solidifies in intimate contact with the undissolved noble metal to provide a diffusion pathway between the solidified indium, tin, lead and noble metal alloy and the remaining noble metal layers; and (c) applying pressure to the stack so formed and while maintaining the pressure, increasing the temperature to a second temperature for a period of time sufficient to allow a diffusion bond to form such that the diffusion bond tensile strength is at least as great as the tensile strength of either of the first and the second components.

2. The method as recited in claim 1, wherein the indium in the alloy is in the range of 12-80 composition %.

3. The method as recited in claim 2, wherein the lead in the alloy is in the range of 15-50 composition %.

4. The method as recited in claim 3, wherein the tin in the alloy is in the range of 37-70 composition %.

5. The method as recited in claim 1, wherein the alloy comprises 25% indium, 37.5% lead and 37.5% tin.

6. The method as recited in claim 5, wherein the second temperature is approximately 350° F.

7. The method as recited in claim 6, wherein the pressure is approximately 150 psi.

8. The method as recited in claim 7, wherein the period of time is in the range of 6-72 hours.

9. The method as recited in claim 7, wherein the period of time is approximately 30-48 hours.

10. The method as recited in claim 9, wherein the first and second components are ceramic material.

11. A method of diffusion bonding first and second mating components, comprising the steps of:
(a) applying a silver electrode to each of the first and second components to form mating surfaces;
(b) positioning a first and a second layer of an alloy consisting essentially of indium, lead and tin between the silver electrode mating surfaces of the first and second components to form a stack and positioning a silver electrode lead with a solder tab between the first and second layers of alloy, while the surrounding temperature is a first temperature less than the liquidus point of the alloy; and (c) applying pressure to the stack so formed and while maintaining the pressure, increasing the temperature to a second temperature for a period of time sufficient to allow
(i) the alloy to partially melt,
(ii) a portion of the silver from the electrodes to diffuse into the alloy,
(iii) the alloy to solidify,
(iv) the indium gradually to diffuse into the silver,
(v) the silver gradually to diffuse into the indium.

12. The method as recited in claim 11, wherein the indium in the alloy is in the range of 12-80 composition %.

13. The method as recited in claim 12, wherein the lead in the alloy is in the range of 15-50 composition %.

14. The method as recited in claim 13, wherein the tin in the alloy is in the range of 37-70 composition %.

15. The method as recited in claim 11, wherein the alloy comprises 25% indium, 37.5% lead and 37.5% tin.

16. The method as recited in claim 15, wherein the second temperature is approximately 350° F.

17. The method as recited in claim 16, wherein the pressure is approximately 150 psi.

18. The method as recited in claim 17, wherein the period of time is in the range of 6-72 hours.

19. The method as recited in claim 17, wherein the period of time is approximately 30-48 hours.

20. The method as recited in claim 19, wherein the first and second components are ceramic material.

21. A method of diffusion bonding first and second ceramics, comprising the steps of:
(a) applying a silver electrode to each of a first and a second ceramics to form mating surfaces;
(b) positioning a first and a second layer of alloy, each layer consisting essentially of 25% indium, 37.5% tin and 37.5% lead, between the silver electrode mating surfaces of the first and the second ceramics, and positioning a silver electrode lead with a solder tab between the first and the second layers of alloy to form a stack, while the surrounding temperature is a first temperature less than the liquidus point of the alloy; and
(c) applying a pressure of approximately 150 psi to the stack so formed, and while maintaining this pressure, increasing the temperature to a second temperature of approximately 350° F. for a period of 30-48 hours to allow
(i) the alloy to partially melt,
(ii) a portion of the silver from the electrodes to diffuse into the alloy,
(iii) the alloy to solidify,
(iv) the indium gradually to diffuse into the silver, and
(v) the silver gradually to diffuse into the indium.

22. The method as recited in claim 21, wherein the resulting tensile strength of the alloy after 48 hours is 5260 psi.

23. A method of diffusion bonding a pair of ceramic resonators coded with a noble metal, comprising the steps of:
fabricating an alloy shim of indium, tin and lead, said alloy shim having a preselected melting point;
contacting one of said ceramic resonators at its noble metal face with a first side of said alloy shim;
contacting the other of said ceramic resonators at its noble metal face with a second side of said alloy shim;
heating said alloy shim to a temperature less than said preselected melting point but sufficiently high enough to soften said alloy shim;
causing a small amount of said noble metal to be dissolved in said softened alloy whereby the melting point of said softened alloy is raised and said alloy resolidifies; and
applying pressure to said ceramic resonators while maintaining them at an elevated temperature, said elevated temperature being substantially below said melting point so that said tin, indium and lead alloy diffuses into said noble metal producing a strong highly elastic mechanical bond between said ceramic resonators.

* * * * *